United States Patent [19]

Athanas

[11] 3,958,266

[45] May 18, 1976

[54] DEEP DEPLETION INSULATED GATE FIELD EFFECT TRANSISTORS

[75] Inventor: Terry George Athanas, Frenchtown, N.J.

[73] Assignee: RCA Corporation, New York, N.Y.

[22] Filed: Apr. 19, 1974

[21] Appl. No.: 462,494

[52] U.S. Cl. .................................... 357/23; 357/4; 357/42; 357/49
[51] Int. Cl.² ................. H01L 29/78; H01L 27/12; H01L 27/02
[58] Field of Search ........................ 357/23, 42, 49

[56] References Cited
UNITED STATES PATENTS 3,653,978 4/1972 Robinson et al. .................... 357/42
3,789,504 2/1974 Jaddam .............................. 357/23

*Primary Examiner*—Andrew J. James
*Assistant Examiner*—E. Wojciechowicz
*Attorney, Agent, or Firm*—H. Christoffersen; R. P. Williams

[57] ABSTRACT

A deep depletion insulated gate field effect transistor is made in a silicon layer on a sapphire substrate, so that its threshold voltage is relatively independent of the thickness of the silicon layer. The silicon layer has two parts, namely, a lower part adjacent to the sapphire substrate which is relatively lightly doped, and an upper part, preferably formed by ion implantation, having a doping concentration on the order of about $2 \times 10^{15}$ atoms/cm³.

2 Claims, 4 Drawing Figures

DEEP DEPLETION INSULATED GATE FIELD EFFECT TRANSISTORS

This invention relates to semiconductor integrated circuit devices of the type which are made in thin, layerlike bodies or islands of semiconductive material on insulating substrates.

High speed, low noise integrated circuit devices have been realized by making them in silicon islands formed epitaxially on insulating substrates, such as sapphire. These circuits usually employ complementary P and N channel insulated gate field effect transistors formed in separate islands on the substrate. When these transistors are operated in the enhancement mode, as in most digital circuits, separate islands which are initially of N type and P type conductivity are required for the P and N channel transistors, respectively. One known way of achieving this structure is to grow a first layer of silicon of one type conductivity, etch away portions of the layer to leave islands of the one type conductivity, then grow a second layer of silicon of the opposite type conductivity in the spaces between the first islands, and etch this second layer to form other islands.

Devices are also known in which complementary operation can be achieved with silicon islands of only one type conductivity, thus avoiding processing steps and obtaining increased yields. In these devices, one transistor of a complementary pair employs source and drain regions of conductivity type opposite to that of the islands (as they are initially formed), and operates in a true enhancement mode. The other transistor employs source and drain regions of the same type conductivity as the islands (as they are initially formed) and operates in the so-called deep-depletion mode. The initial doping concentration and thickness of the semiconductor material, the material of the gate electrode (i.e., its work function), and the circuit conditions, that is, the voltage levels employed in circuit operation, are chosen such that this transistor can have its channel depleted all the way through the thickness of the semiconductive material to produce the "off" condition of the device. The acceptance of these devices has been impeded because very close control of the thickness of the semiconductor material and its doping level has been required to produce devices with yields sufficiently high so as to be economically practical.

Figure 1:
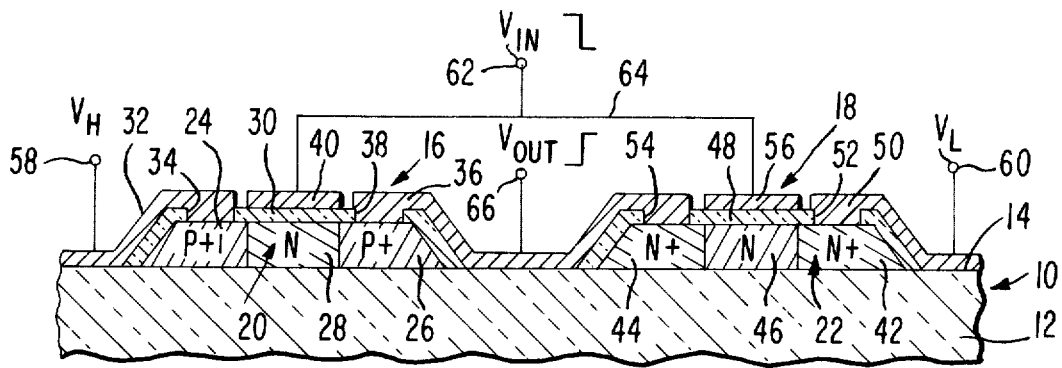
FIG. 1 is a partial cross section and schematic of a complementary integrated circuit device made in accordance with the prior art.

As stated above, semiconductor devices are known in which complementary N channel and P channel insulated gate field effect transistors have been made in semiconductor islands of the same type conductivity. These are devices in which one of the transistors operates in the enhancement mode and the other in the so-called deep-depletion mode. A representative structure of such a device is illustrated at 10 in FIG. 1.

The device 10 includes a substrate 12 of monocrystalline insulating material 12 of any suitable material, preferably a material such as single crystal sapphire, chrome-doped gallium arsenide, or spinel, which has a surface 14 on which a layer of single-crystal semiconductor material can be grown. On the surface 14 of the substrate 12 are two transistors, 16 and 18. The transistor 16 includes a body 20 of semiconductive material which is on and epitaxially related to the substate 12. Similarly, the transistor 18 includes a body 22 of semiconductive material on and epitaxially related to the substrate 12. The bodies 20 and 22 each have the same initial type of conductivity and the same initial degree of conductivity. In this case, the conductivity of the bodies 20 and 22 is N type.

The transistor 16 further comprises spaced source and drain regions 24 and 26, of P+ type conductivity in this example, in the body 20 and defining between them a charge carrier channel zone 28. The body of semiconductive material 20 is coated with a layer of insulating material 30 which preferably has a thickness and composition suitable for use as the gate insulator of the device. A source electrode 32 extends through an opening 34 in the oxide coating 30 into contact with the source region 24. A drain electrode 36 extends through an opening 38 in the oxide coating 30 into contact with the drain region 26. A gate electrode 40 of P+ type polycrystalline silicon, for example, overlies the insulating coating 30 over the charge carrier channel 28.

The transistor 18 has spaced source and drain regions 42 and 44, which define between them a charge carrier channel 46. In this example, the source and drain regions 42 and 44 are of N+ type conductivity. An insulating coating 48, like the insulating coating 30, covers the body 22 of semiconductive material.

A source electrode 50 extends through an opening 52 in the insulating coating 48 to contact the source region 42 of the transistor 18. In this example, the drain electrode 36 of the transistor 16 also extends through an opening 54 in the insulating coating 48 into contact with the drain region 44 of the transistor 18. A gate electrode 56 overlies the insulating coating 48 over the charge carrier channel 46.

Schematic connections to the various electrodes described above are shown in FIG. 1 as connecting the two transistors 16 and 18 together as an inverter. There is a terminal 58, labeled $V_H$, which is connected to the source electrode 32 of the transistor 16. There is a terminal 60, labeled $V_L$, connected to the source electrode 50 of the transistor 18. The subscripts H and L intended to suggest relatively high tga and relatively low tga voltages, respectively. An input terminal 62, labeled $V_{IN}$, is connected via a conductor 64 to each of the gate electrodes 40 and 56. An output terminal 66, labeled $V_{OUT}$, is connected to the drain electrode 36. The inverter connection is shown for illustrative purposes only, and it will be understood that other circuit combinations of two or more complementary transistors may be achieved.

The device 10 operates as an inverter as follows. Relatively high and relatively low supply voltages are applied to the terminals 58 and 60, respectively. A relatively high or low voltage, i.e., a step function, may then be applied to the input terminal 62. When the input terminal 62 is at the relatively high voltage level $V_H$, the transistor 16 is off, and the transistor 18 is on. In this case, the transistor is on because, owing to the relatively high voltage on its gate electrode 56, it is not depleted and an ohmic conduction path exists between its source and drain. A low voltage, on the other hand, depletes the conduction channel 46 of the transistor 18 and turns this transistor off when the conduction channel is depleted entirely through the thickness of the body 22. With a high voltage on the input terminal 62, the output terminal 66 is effectively coupled to the terminal 60 and the output is low.

When a relatively low voltage is applied to the input terminal 62, the transistor 16 is enhanced to the "on" condition, and the transistor 18 is depleted to the "off" condition. In this case, the output terminal 66 is effectively coupled to the terminal 58 so that the output of the circuit is high. Thus, the input voltage is inverted, as indicated by the schematic voltage level symbols adjacent to the $V_{IN}$ and $V_{OUT}$ labels.

The operation of the transistor 18 is determined by several factors. An expression which relates the threshold voltage of the transistor 18 to these factors is as follows:

$$V_{TH} = V_{GSC} - \frac{t_{ox}}{E_{ox}} q N t_s - \frac{q N t_s^2}{2 E_s} \quad (1)$$

where:

| | |
|---|---|
| $V_{TH}$ | is the threshold voltage of the transistor 18; |
| $V_{GSC}$ | is the work function difference between the material of the gate electrode 56 and the material of the body 22; |
| $t_{ox}$ | is the thickness of the insulating coating 48; |
| $E_{ox}$ | is the dielectric constant of the insulating coating 48; |
| $q$ | is the charge on an electron; |
| $N$ | is the quiescent concentration of conductivity modifiers in the charge carrier channel 46; |
| $t_s$ | is the thickness of the body 22; and |
| $E_s$ | is the dielectric constant of the body 22. |

This equation disregards the effect of surface states on the threshold voltage. As is generally known, surface states ($Q_{ss}$) may reduce the threshold voltage of an N type deep-depletion device by an amount proportional to $$\frac{t_{ox} Q_{ss}}{E_{ox}}$$

If $Q_{ss}$ can be kept quite small, as it can in practice, this factor can be neglected. The above expression also assumes that the body 22 of semiconductive material is uniformly doped, as has been true heretofore. Inspection of this equation shows that the threshold voltage is highly dependent on the thickness of the semiconductive material and on the concentration of impurities therein.

Figure 2:
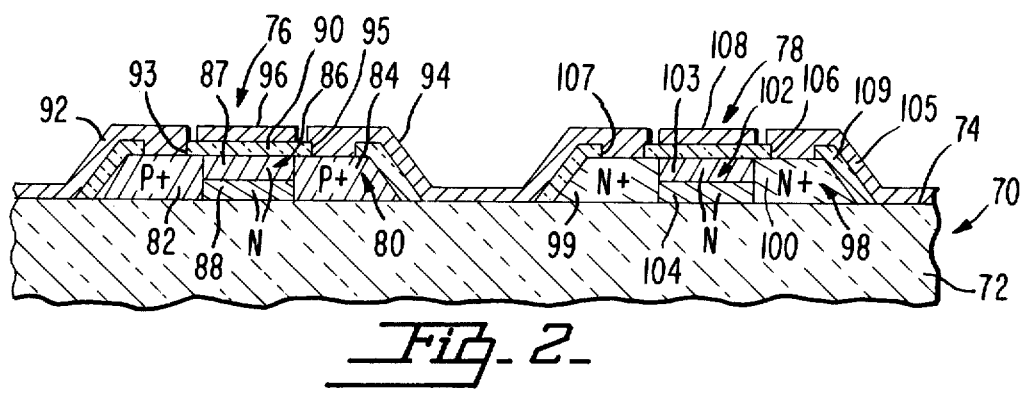
FIG. 2 is a cross section similar to that of FIG. 1 but showing the present novel device.

FIG. 2 shows the present novel device, indicated generally at 70. The device 70 includes a substrate 72, similar to the substrate 12 of the device 10, which has a surface 74 on which are disposed two transistors 76 and 78. The transistor 76 is an enhancement mode device like the transistor 16. It includes a layerlike body 80 of semiconductive material in which are disposed two spaced P+ type regions, 82 and 84, preferably extending throughout the thickness of the body 80 and defining between them a charge carrier channel 86. The channel 86 has two parts, 87 and 88. The part 88 is of relatively low, nearly intrinsic, conductivity; and the part 87 is of relatively high N type conductivity in this example.

An insulating coating 90 covers the semiconductor body 80. A source electrode 92 extends through an opening 93 in the insulating coating 90 to contact the source region 82 of the transistor 76. A drain electrode 94 extends through an opening 95 to contact the drain region 94 of the transistor 76. A gate electrode 96 overlies the insulating coating 90 over the channel region 86. The two-conductivity channel region provides no advantage to the P channel transistor in this embodiment, but is included for ease of manufacture, as will appear below.

The N type transistor 78 in this example is a deep-depletion device, like the transistor 18. The transistor 78 includes a layerlike body 98 of semiconductive material which has within it spaced, highly doped regions 99 and 100, which preferably extend throughout the thickness of the body 98 and define between them a charge carrier channel 102. The charge carrier channel 102 is divided into two parts, 103 and 104, respectively, which have in this example the same thickness and doping profile as the regions 87 and 88. The conductivity in the part 103 is less than that of the regions 99 and 100. There may be further parts within the channel 102, but in this example, only two are shown, the part 104 extending from the part 103 to the substrate 72. An insulating coating 109 overlies the body 98 of semi-conductive material. A source electrode 105 extends through an opening 106 in the insulating coating 109 to contact the region 100 of the transistor 78. The drain contact 94 may also, in this example, extend through an opening 107 in the insulating coating 109 to contact the region 99 of the transistor 78. A gate electrode 108, which like the gate electrode 56 of the transistor 18 may be of P+ type polycrystalline silicon, overlies the insulating coating 109 over the charge carrier channel 102.

The upper parts 87 and 103 of the two channels 86 and 102, respectively, are relatively highly doped, whereas the lower parts 88 and 104 are very lightly doped. In a prior art device such as that shown in FIG. 1, the uniformly doped channel regions 28 and 46 would usually be doped to a level of about $2 \times 10^{15}$ atoms/cm$^3$. In the novel device 70, the upper parts 87 and 103 of the channel regions 86 and 102 may have a doping concentration of about this same value or even greater, typically up to about $1 \times 10^{16}$ atoms/cm$^3$. The lower parts 88 and 104 of the channel regions 86 and 102 preferably contain conductivity modifiers in an amount on the order of about $10^{13}$ atoms/cm$^3$. The thickness of the upper parts 87 and 103 preferably should be controlled to be between about 3000A and about 6000A. As will appear from the discussion to follow, the total thickness of the bodies 80 and 98 in the device 70 is not critical and may be anywhere between about 4000A and about 12,000A. Note that under some circumstances, the lower parts 88 and 104 may be quite thin. Transistors made in thin epitaxial layers with a "deeper" implant profile are not as good as transistors with "shallower" implant profiles, so that, preferably, the parts 88 and 104 should be present, even though they may be thin.

As stated, the concentration of conductivity modifiers in the lower parts 88 and 104 of the channel regions 86 and 102, respectively, is on the order of $10^{13}$ atoms/cm$^3$. The gate voltage required to deplete such material is negligible compared to the voltage necessary to deplete a region of equivalent thickness containing modifiers at the $2 \times 10^{15}$ atoms/cm$^3$ level; it can be shown that this depletion voltage is approximately two orders of magnitude less. It is, therefore, acceptable to disregard the lower part 104 as a factor in voltage consumption. Consequently, the expression for the threshold voltage for the transistor 78 can be as follows:

$$V_{TH} = V_{GSC} - \frac{t_{ox}}{E_{ox}} q N_{103} t_{103} - \frac{q N_{103}(t_{103})^2}{2E_s} \quad (2)$$

where $V_{TH}$, $V_{GSC}$, $t_{ox}$, $E_{ox}$, $q$, and $E_s$ all have the same meaning as in Equation (1) above; $N_{103}$ is the doping concentration in the region 103, and $t_{103}$ is the thickness of the region 103. This equation is independent of the total thickness of the body 98. Improved yields may therefore be expected in manufacturing the device 70 because, heretofore, control of the thickness of epitaxial material on an insulating substrate and of doping concentration has been a problem. Unacceptable statistical variations in threshold voltage have resulted. With the present novel structure, the threshold voltage is dependent only on the thickness and concentration of the upper part 103 of the transistor 78, and as will appear in the following description, these factors can be closely controlled by employing the process of ion implantation to establish the part 103.

Figure 3:
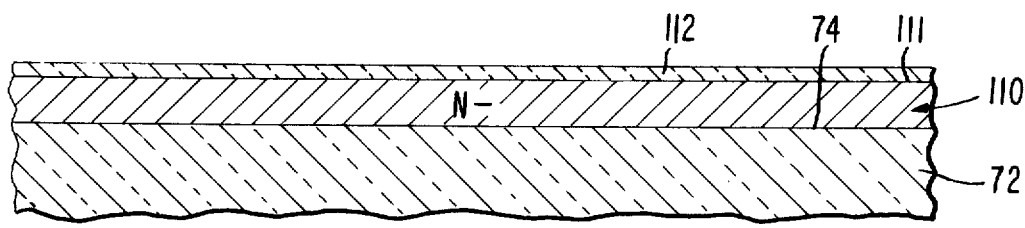
FIGS. 3 and 4 are partial cross sections illustrating steps in the present novel method.
Figure 4:
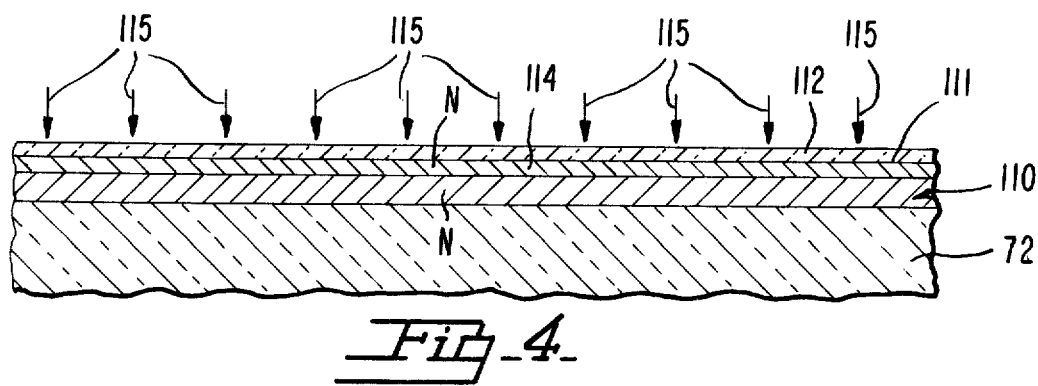

FIGS. 3 and 4 illustrate some of the steps in a method of manufacturing the present novel device. The device is preferably made with a starting wafer or substrate 72 of a material such as sapphire which will promote the epitaxial growth of silicon. A surface 74 of the substrate 72 is oriented substantially parallel to the (1102) crystallographic planes in the sapphire, and a layer 110 of substantially intrinsic N type silicon is grown thereon. This surface orientation of the sapphire will cause the silicon to grow in the direction of the <100> axis such that the top surface 111 of the layer 110 is parallel to the (100) crystallographic planes. The conditions during growth should be adjusted so that the silicon is doped to a level on the order of $10^{13}$ atoms/cm³. This epitaxial growth step is generally known and may be done by the thermal decomposition of silane ($SiH_4$). A small amount of phosphine ($PH_3$) may be added, if desired, to the growth atmosphere to insure that the silicon is N type.

A thin layer 112 of silicon dioxide is next formed on the surface 111 of the silicon layer 110. For example, the layer 112 may be a layer of silicon dioxide formed by heating the substrate 72 and the layer 110 thereon to a temperature of about 875°C for a period of about 15 minutes in an oxidizing atmosphere comprising steam and a small amount of gaseous HCl. This results in a clean silicon dioxide layer having a thickness of about 250A.

The wafer having the configuration shown in FIG. 3 is next placed in conventional ion implantation apparatus, and a zone 114 of more conductive material is formed in the layer 110 at the upper side thereof, adjacent to the surface 111. Ions are accelerated toward the wafer, as suggested by the plurality of arrows 115. The implant energy can vary over a wide range and the choice of the energy depends on the specific doping profile which is desired in the zone 114. Energies from about 50 Kev to about 200 Kev can be used as desired. In one example of a device made in accordance with this method, an implant energy of 150 Kev was used. An energy of 70 Kev has also been used with success.

The other parameter required to describe the implantation is the dose rate. Again, this rate may vary, and the dose may lie anywhere between about $1 \times 10^{11}$ atoms/cm² and about $5 \times 10^{11}$ atoms/cm². In the specific example mentioned in the foregoing paragraph, where the implant energy was 150 Kev, a dose rate which provided good results in terms of the production of the desired doping concentration in the $2 \times 10^{15}$ atoms/cm³ level and without significant damage to the silicon was $1.4 \times 10^{11}$ atoms/cm². A similar dose rate was used in the 70 Kev implant.

Once the zone 114 is established in the layer 110 by the above-described methods, conventional processes may be applied to form the transistors 76 and 78 of the finished device 70.

While the above description has been in terms of producing an N type deep depletion transistor 78 in a complementary integrated circuit device, it will be understood by those of ordinary skill that P type deep-depletion transistors can also be made by using a P type rather than an N type epitaxial layer. Care must be taken to select a gate material, however, which is appropriate to P type silicon because of the criticality of the work function difference $V_{GSC}$ between the gate material and the silicon in the above equations. For P type deep-depletion devices, aluminum or N+ doped polycrystalline silicon can be used satisfactorily as the gate material. N type deep depletion devices can be made with several gate materials, among which one example is P+ type polycrystalline silicon.

What is claimed is:
1. An integrated circuit device comprising:
   an insulating substrate,
   a plurality of thin, layerlike bodies of monocrystalline semiconductive material, all initially of the same given type conductivity on said substrate, and each having a surface substantially parallel to the surface of the substrate, and
   means including at least one of said bodies forming an insulated gate field effect transistor operable in the deep-depletion mode, said means comprising spaced source and drain regions of said given type conductivity in said one body defining therebetween a conduction channel region, an insulating layer on said surface of said one body adjacent to said channel region and gate electrode means on said insulating layer, said channel region having a first part adjacent to said surface having a thickness less than that of said body, having said given type conductivity and having a conductivity such that a predetermined voltage applied to said gate electrode, relative to that applied to said body, will effectively deplete said first part of mobile charge carriers, said channel region also having a second part beneath said first part, extending throughout the remainder of the thickness of said channel region, having said given type conductivity and having a conductivity less than that of said first part such that a voltage substantially less than said predetermined voltage will effectively deplete it of charge carriers.

2. An integrated circuit device as defined in claim 1, wherein:
   said substrate is monocrystalline sapphire,
   said layerlike bodies are monocrystalline silicon and said spaced regions each extend throughout the thickness of said body,
   said first part contains conductivity modifiers in a substantial portion thereof having a density on the order of $10^{16}$ modifiers/cm³, and
   said second part contains conductivity modifiers having a density on the order of $10^{13}$ modifiers/cm³ throughout a large portion of its volume.

* * * * *